(12) United States Patent
Yoshimura (10) Patent No.: US 6,527,963 B1
(45) Date of Patent: Mar. 4, 2003

(54) METHOD OF MANUFACTURING MULTILAYER WIRING BOARDS

(75) Inventor: Eiji Yoshimura, Okaya (JP)

(73) Assignee: Daiwa Co., Ltd., Nagano-ken (JP)

( * ) Notice: Subject to any disclaimer, the term of this patent is extended or adjusted under 35 U.S.C. 154(b) by 0 days.

(21) Appl. No.: 09/600,424
(22) PCT Filed: Nov. 18, 1998
(86) PCT No.: PCT/JP98/05192
§ 371 (c)(1),
(2), (4) Date: Jul. 13, 2000
(87) PCT Pub. No.: WO00/30420
PCT Pub. Date: May 25, 2000

(51) Int. Cl.⁷ ............................................. H01B 13/00
(52) U.S. Cl. ........................... 216/13; 174/295; 427/35
(58) Field of Search ........................ 216/13; 174/295; 427/35

(56) References Cited

U.S. PATENT DOCUMENTS

| | | | |
|---|---|---|---|
| 4,659,587 A | * | 4/1987 | Imura et al. .................. 427/35 |
| 5,480,048 A | * | 1/1996 | Kitamura et al. ............. 216/13 |
| 5,600,103 A | * | 2/1997 | Odaira et al. ................ 174/295 |

FOREIGN PATENT DOCUMENTS

| | | |
|---|---|---|
| EP | 0 457 501 A2 | 11/1991 |
| JP | 58-213451 | 12/1983 |
| JP | 61-121392 | 6/1986 |
| JP | 5-291744 | 11/1993 |
| JP | 6-21651 | 1/1994 |
| JP | 6-310857 | 11/1994 |
| JP | 6-314878 | 11/1994 |

\* cited by examiner

Primary Examiner—Randy Gulakowski
Assistant Examiner—Gentle E Winter
(74) Attorney, Agent, or Firm—Knobbe Martens Olson & Bear LLP (57) ABSTRACT

In a method of manufacturing a multilayer wiring board according to the present invention having the step of after forming a column-like metallic body on a lower wiring layer, forming an upper wiring layer whose part is conductively connected with the column-like metallic body, the column-like metallic body is formed by the step of coating the lower wiring layer with a conductor showing durability at the time of etching metal composing the column-like metallic body so as to form a conductive layer, the step of forming a plating layer of the metal composing the column-like metallic body on a whole surface including the conductive layer, the step of forming a mask layer on a surface portion of the plating layer where the column-like metallic body is formed, and the step of etching the plating layer. The present invention can provide the method of manufacturing a multilayer wiring board which can form the column-like metallic body having uniform height for short time according to a simple and low-priced method.

10 Claims, 6 Drawing Sheets

METHOD OF MANUFACTURING MULTILAYER WIRING BOARDS

This application is the U.S. National Phase under 35 U.S.C. §371 of International Application PCT/JP98/05192, filed Nov. 18, 1998.

TECHNICAL FIELD

The present invention relates to a method of manufacturing a multilayer wiring board having tow or more wiring layers. More specifically, this invention relates to a method of manufacturing a multilayer wiring board having the step of after forming a column-like metallic body on a lower wiring layer, forming an upper wiring layer whose part is conductively connected with the column-like metallic body.

BACKGROUND ART

In recent years, as electronic equipment and the like are miniaturized and light-weighted, electronic parts are miniaturized and the density of wiring boards to which the electronic parts are mounted is required to be high. In order to heighten the density of the wiring boards, a method of heightening line density of wiring layers or a method of obtaining a multilayer structure by laminating a plurality of wiring layers are adopted.

The method of manufacturing a multilayer wiring board includes a joining method of forming wiring layers respectively on a plurality of substrates and joining the substrates in a state that insulating sheets intervene between the substrates, and a build-up method of forming insulating layers on a substrate on which a wiring pattern is formed and forming the wiring pattern on an insulating layer, namely, of forming a laminated structure by repeating formation of an insulating layer and a wiring pattern.

In the multilayer wiring board, conductive connection between the wiring layers should be carried out according to a circuit design. For this reason, the build-up method of electrically connecting different wiring layers through a via hole ins adopted. This method will be explained with reference to FIG. 5.

Copper foils are formed on a surface of a substrate 1, and a pattern is formed on a first wiring layer 2 (see FIG. 5(1)) by a photo-lithography method. A photo resist or the lie is applied to the first wiring layer 2 so that an insulating layer 3 is formed (see FIG. 5(2)). Next, a mask 4 where a via hole pattern is formed is overlapped and exposure 5 and image development are carried out so that concave section 6 which reaches the first layer pattern is formed (see FIG. 5(4)). A copper thin film 7 and a copper plating film 8 are formed inside the concave section 6 by electroless copper plating and electrolytic copper plating (see FIGS. 5(5) and 5(6)). Thereafter, the copper plating film 8 is patterned to form a second wiring layer 10 and a via hole 9 (see FIG. 5(7)). This step is repeated to form more layers in the wiring board.

As a method of manufacturing a simple and low-priced printed-wiring board, Japanese Patent Application Laid-Open No. 6-314878 (1994) discloses a method of after forming a column-like conductor on a lower wiring layer, forming an upper wiring layer so as to conductively connect the wiring layers. This method will be explained below with reference to FIG. 6.

A conductive thin film layer 12 is formed on a surface of a substrate 11 by sputtering or the like (see FIG. 6(1)), and a pattern is formed thereon by electrolytic copper plating using a plating resist or the like (see FIG. 6(2)). Next, a plating resist is uniformly applied thereto, and exposure and image development are carried out so that a resist pattern 14 which is opposite to a via hole is formed (see FIG. 6(3)). Thereafter, while conducting with the conductive thin film layer 12, copper is deposited on a concave section 15 of the resist pattern 14 by electrolytic copper plating so that a copper column-like body 16 corresponding to a via hole is formed (see FIG. 6(4)). The resist pattern 14 is peeled and an exposed part of the conductive thin film layer 12 is removed by etching (see FIG. 6(5)). An insulating resin 17 is applied to the whole surface (see FIG. 6(6)), and this surface is heated and pressurized and flattened by a press apparatus so as to be flush with a height of the copper column-like body 16 (see FIG. 6(7)).

However, in this method, the height of the copper column-like body becomes non-uniform easily. Since electrolytic plating is carried out in a hole, bubbles are generated, causing a problem in that current density is not heightened, and it takes a long time to form the copper column-like body. Further, the formation of a resist pattern requires a complicated step such as laser emission or the like. As a result, this method is not advantageous from the view point of the cost.

Therefore, it is an object of the present invention to provide a simple and low-cost method of manufacturing a multilayer wiring board where a column-like metallic body having a more uniform height can be formed in a short time.

DISCLOSURE OF THE INVENTION

The above object can be achieved by the following present invention. Namely, a method of manufacturing a multilayer wiring board having the step of after forming a column-like metallic body on a lower wiring layer, forming an upper wiring layer whose part is conductively connected with the column-like metallic body, characterized in that the column-like metallic body is formed by the steps, comprising (a) the step of coating the lower wiring layer with a conductor showing durability at the time of etching metal composing the column-like metallic body so as to form a conductive layer;

(b) the step of forming a plating layer of the metal composing the column-like metallic body on a whole surface including the conductive layer;

(c) the step of forming a mask layer on a surface portion of the plating layer where the column-like metallic body is formed; and (d) the step of etching the plating layer.

According to the present invention, when the plating layer is formed previously on the whole surface at step (b), since the height of the portion where the column-like metallic body is formed is approximately uniform, the column-like metallic body having approximately uniform height can be formed. Moreover, at step (b), since the plating layer is formed not in a hole but on the whole surface, the plating layer having a desired thickness can be formed for short time with high current density, and the whole step time can be shorted. Further, at the step (c), since the mask layer is formed not on the whole surface having a hole but in a scattered point form, it can be formed by a simple and low-priced method such as printing.

As a result, the method of manufacturing a multilayer wiring board, which can form the column-like metallic body having uniform height for short time according to the simple and low-priced method, can be provided.

At the step (a), conductive paste (conductive coating) or the like can be used. However, it is preferable that the step (a) separates out the metal, which shows durability at the time of etching the metal composing the column-like metallic body, on the lower wiring layer according to electroless plating in which the metal composing the lower wiring layer is used as catalyst so as to form the conductive layer. As a result, the conductive layer can be formed selectively on the wiring layer, and a protective film having high etching resistance can be formed as the conductive layer by the simple method.

At this time, it is preferable that the metal composing the column-like metallic body is copper, and the conductive layer is made of nickel-gold alloy or tin-lead solder alloy. These alloys can be selectively plated by using copper as a catalyst and shows high durability at the time of etching copper. As a result, they can be used suitably as the metal composing the conductive layer.

In addition, as for the formation of the mask layer, various methods using dry film resist, organic compound type resist, metal resist or the like can be adopted. However, the printing method is preferable. In the present invention, since the mask layer is formed in scattered point form, the printing method can be adopted. As a result, the mask layer can be formed by the simple and low-cost step.

Meanwhile, the multilayer wiring board of the present invention is a multilayer wiring board which is manufactured by one of the above manufacturing methods. Since the column-like body in the multilayer wiring board is formed by etching after panel plating, a defect hardly occurs, and the lower wiring layer can be conductively connected with the upper wiring layer with high reliability.

BRIEF DESCRIPTION OF DRAWINGS

FIGS. 1(1) through 1(4) are step diagrams showing one example of a method of manufacturing a multilayer wiring board of the present invention;

FIGS. 2(5) through 2(7) are step diagrams showing one example of the method of manufacturing a multilayer wiring board of the present invention;

FIGS. 3(8) and 3(9) are step diagrams showing one example of the method of manufacturing a multilayer wiring board of the present invention;

FIGS. 5(1) through 5(7) are step diagrams showing one example of a prior method of manufacturing a multilayer wiring board; and FIGS. 6(1) through 6(7) are step diagrams showing one example of a prior method of manufacturing a multi-player wiring board.

With respect to the diagrams, 21 is a substrate, 22 is a lower wiring layer, 23 is a conductive layer, 24 is a plating layer, 24a is a column-like metallic body, 25 is a mask layer, and 27 is an upper wiring layer.

BEST MODE FOR CARRYING OUT THE INVENTION

There will be detailed below the best embodiment of the present invention. The present embodiment refers to an example that when a wiring layer is laminated on both surfaces of a substrate, a column-like metallic body is formed on both sides of the substrate.

As shown in FIG. 1(1), a substrate 21 where a wiring layer 22 is patterned on its both surfaces is prepared. At this time, any pattern forming method may be used, so a method using etching resist, or a method using pattern plating resist can be used. As the substrate 21, a substrate which is made of glass fiber and various reactive cured resin such as polyimide resin can be used. Moreover, as metal composing the wiring layer 22, normally copper, nickel, tin or the like is used.

At step a, as shown in FIG. 1(2), the lower wiring layer 22 is coated with a conductor, which shows durability at the time of etching metal composing the column-like metallic body 24a, so that the conductive layer 23 is formed. The present embodiment refers to an example that the metal, which shows durability at the time of etching the metal composing the column-like metallic body 24a, is separated out on the wiring layer 22 by electroless plating where using metal composing the wiring layer 22 as catalyst so that the conductive layer 23 is formed. More specifically, the metal composing the column-like metallic body 24a is copper, and the metal composing the conductive layer 23 is, for example, nickel-gold alloy or tin-lead solder alloy.

The electroless plating method is exemplified by a step of soaking a substrate-to-be-plated in a plating solution in which the above metal is dissolved and a step of conducting the plating treatment for a predetermined time at a predetermined temperature. At this time, as the plating solution, a solution containing a metallic ion source, alkaline source, reducing agent, chelator or the like can be used. Such a solution available on the market can be used.

Any layer may be used as the conductive layer 23 as long as it protects the wiring layer 22 at the time of etching and simultaneously does not short-circuit the wiring layer 22. For this reason, it is not necessary to cover the wiring layer 22 completely, and the conductive layer 23 may partially cover the surface of the substrate 21 where the wiring layer 22 is not formed. Moreover, from this viewpoint, the thickness of the conductive layer 23 may be set at a suitable value, but 5 or more $\mu$m is preferable.

At step b, as shown in FIG. 1(3), the metal plating layer 24 composing the column-like metallic body 24a is formed on the whole surface including the conductive layer 23. As this metal, normally copper, nickel or the like is used, and a plating method such as electroless plating or a combination of electroless plating and electrolytic plating is used. A concrete thickness of the plating layer 24 is, for example, 20 to 200 $\mu$m or more.

At step c, as shown in FIG. 1(4), the mask layer 25 is formed on a surface portion of the plating layer 24 where the column-like metallic body 24a is formed. The present embodiment shows an example that the mask layer 25 is printed in scattered point form by screen printing. Individual sizes (area, outer diameter or the like) of the mask layer 25 are determined according to the size of the column-like metallic body 24a, and the mask layer 25 having the outer diameter of 100 to 300 $\mu$m or more is exemplified.

At step d, as shown in FIG. 2(5), the plating layer 24 is etched. The etching method is exemplified by etching methods using various etching solutions according to the type of metal composing the plating layer 24 and the conductive layer 23. For example, in the case where the plating layer 24 (namely, the column-like metallic body 24a) is made of copper and the conductive layer 23 is made of nickel-gold alloy or tin-head solder alloy, an alkaline etching solution on the market is used.

According to the above etching, as shown in FIG. 2(5), the wiring layer 22 which is covered with the conductive layer 23, the column-like metallic body 24a and the mask layer 25 are not etched so as to remain.

Next, as shown in FIG. 2(6), the mask layer 25 is removed, and it may be removed by an agent or by peeling suitably and selectively according to the type of the mask layer 25. For example, in the case where the mask layer 25 is photosensitive ink which is formed by screen printing, it is removed by an alkaline agent or the like.

As shown in FIG. 2(7), an insulating material 26a for forming the insulating layer 26 is applied. As the insulating material 26a, reactive cured resin such as liquid polyimide resin which has satisfactory insulation and is low-priced can be used. This liquid polyimide resin is applied by the various methods so that the thickness of the insulating material 26a becomes slightly larger than the height of the column-like metallic body 24a, and the resin can be cured by heating, light emission or the like. As the application method, hot press and various coaters are used.

As shown in FIG. 3(8), the cured insulating material 26a is ground or abraded so that the insulating layer 26 whose thickness is approximately the same as the height of the column-like metallic body 24a is formed. The grinding method is exemplified by a method which uses a grinding apparatus where a plurality of hard rotary blades made of diamond are arranged in a radial direction of a rotary board. The hard rotary blade, which is being rotated, is moved along an upper surface of the fixed wiring board so that the upper surface can be flattened. Moreover, abrading method is exemplified by a method of slightly abrading by means of a belt sander, buffing or the like.

Next, as shown in FIG. 3(9), the upper wiring layer 27 whose part is conductively connected with the column-like metallic body 24a is formed. The wiring layer 27 can be formed by the method which is the same as the method of forming the lower wiring layer 22. For example, a predetermined mask is formed by the photo-lithography technique and undergoes the etching process, so that the wiring layer 27 having a predetermined pattern can be formed.

Figure 1:
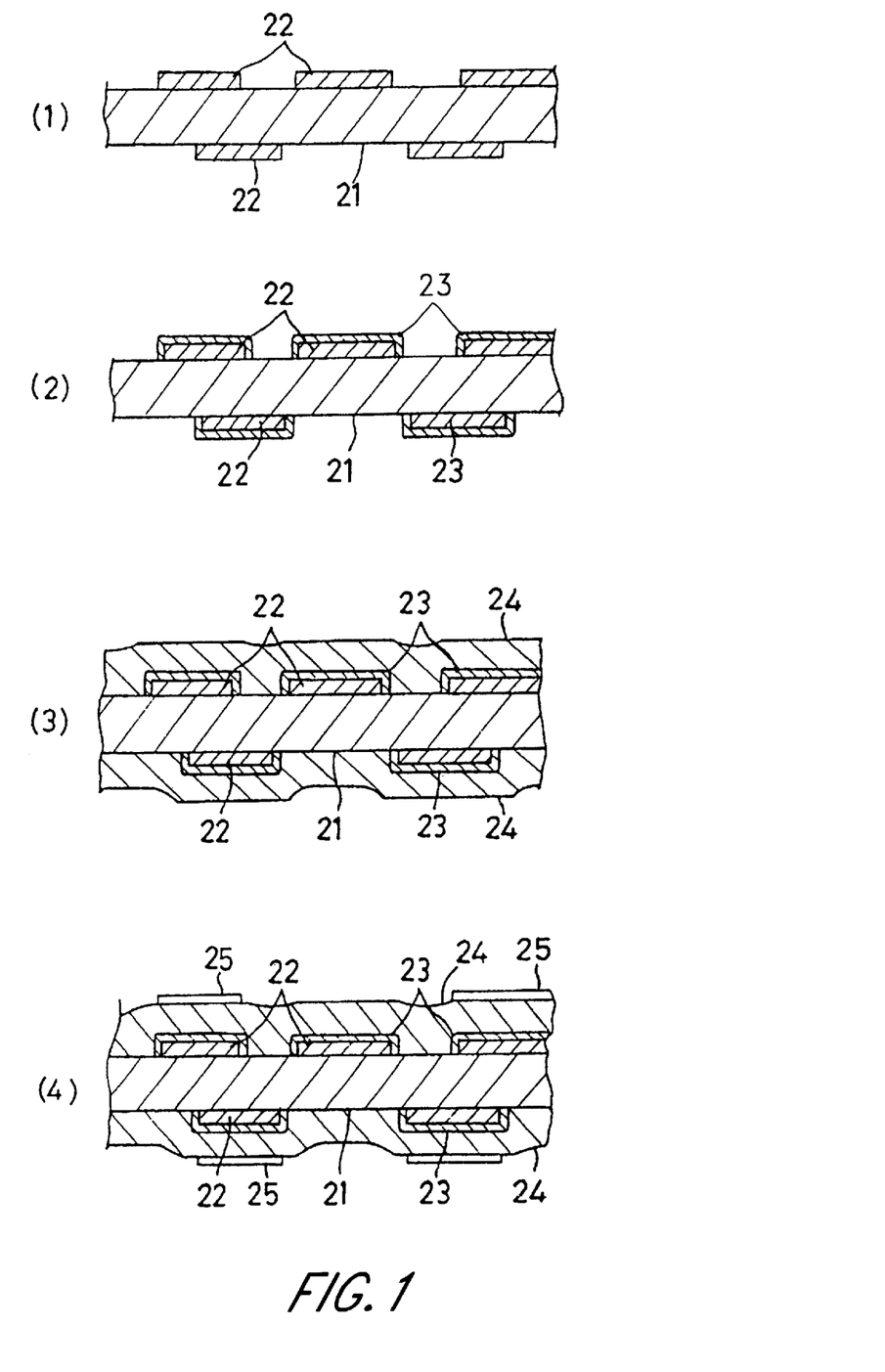
Figure 2:
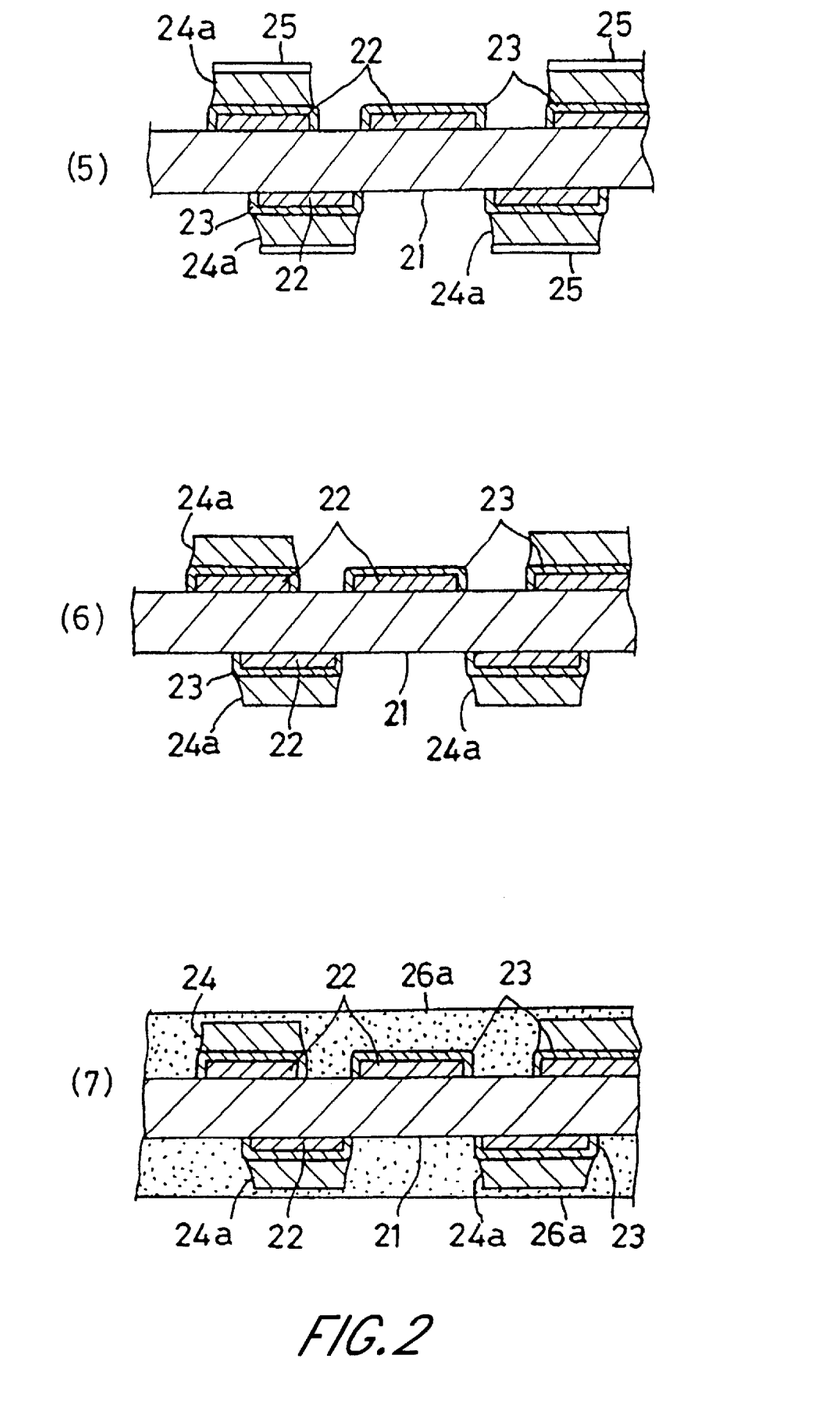
Figure 3:
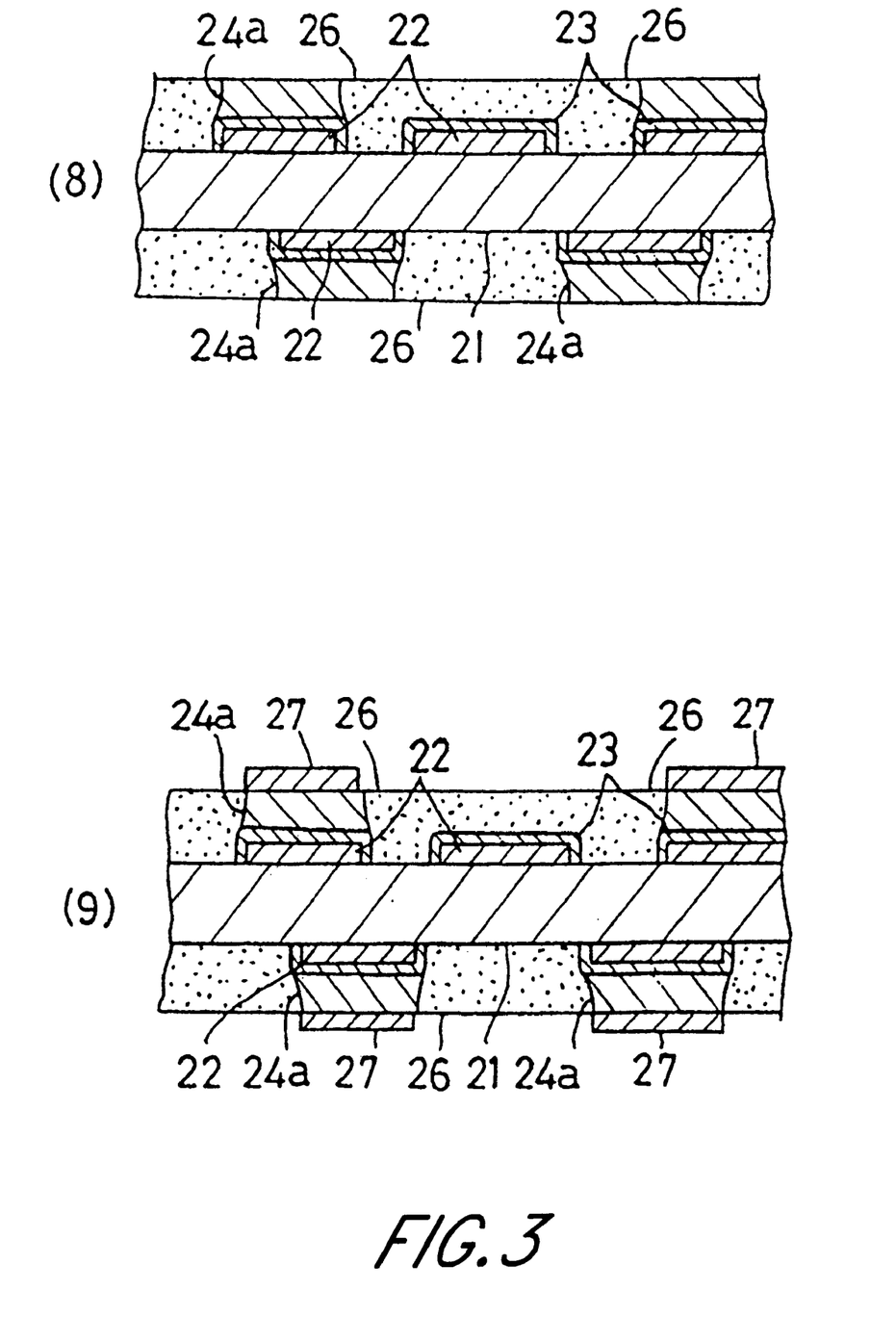
Figure 4:
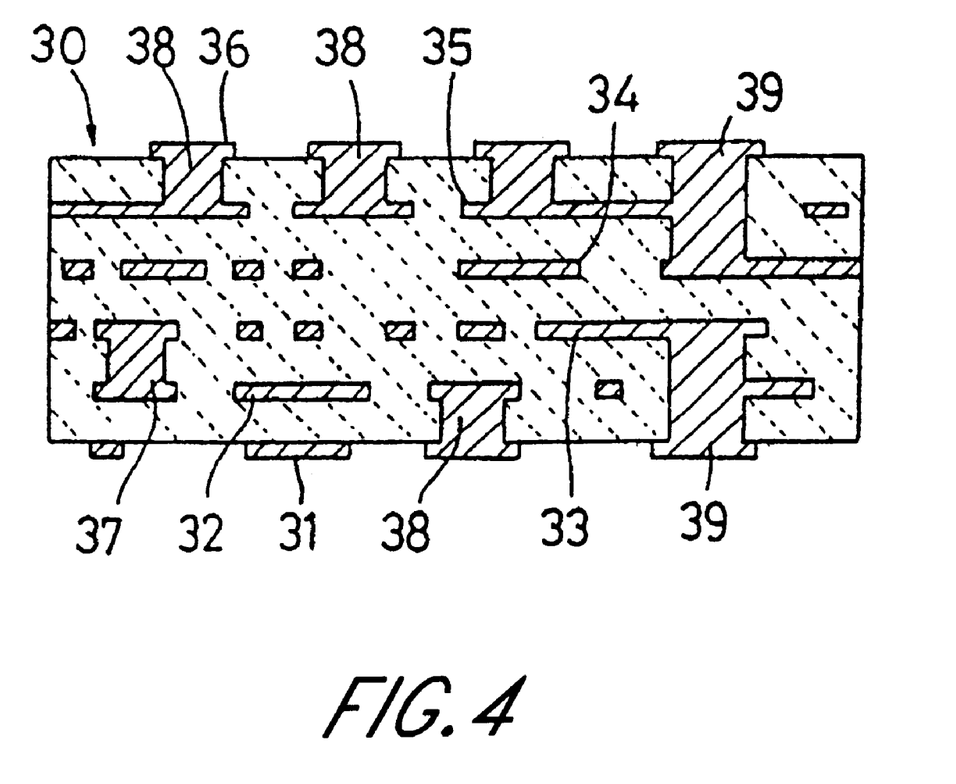
FIG. 4 is a partial cross section showing one example of the multilayer wiring board which can be formed by the present invention.
Figure 5:
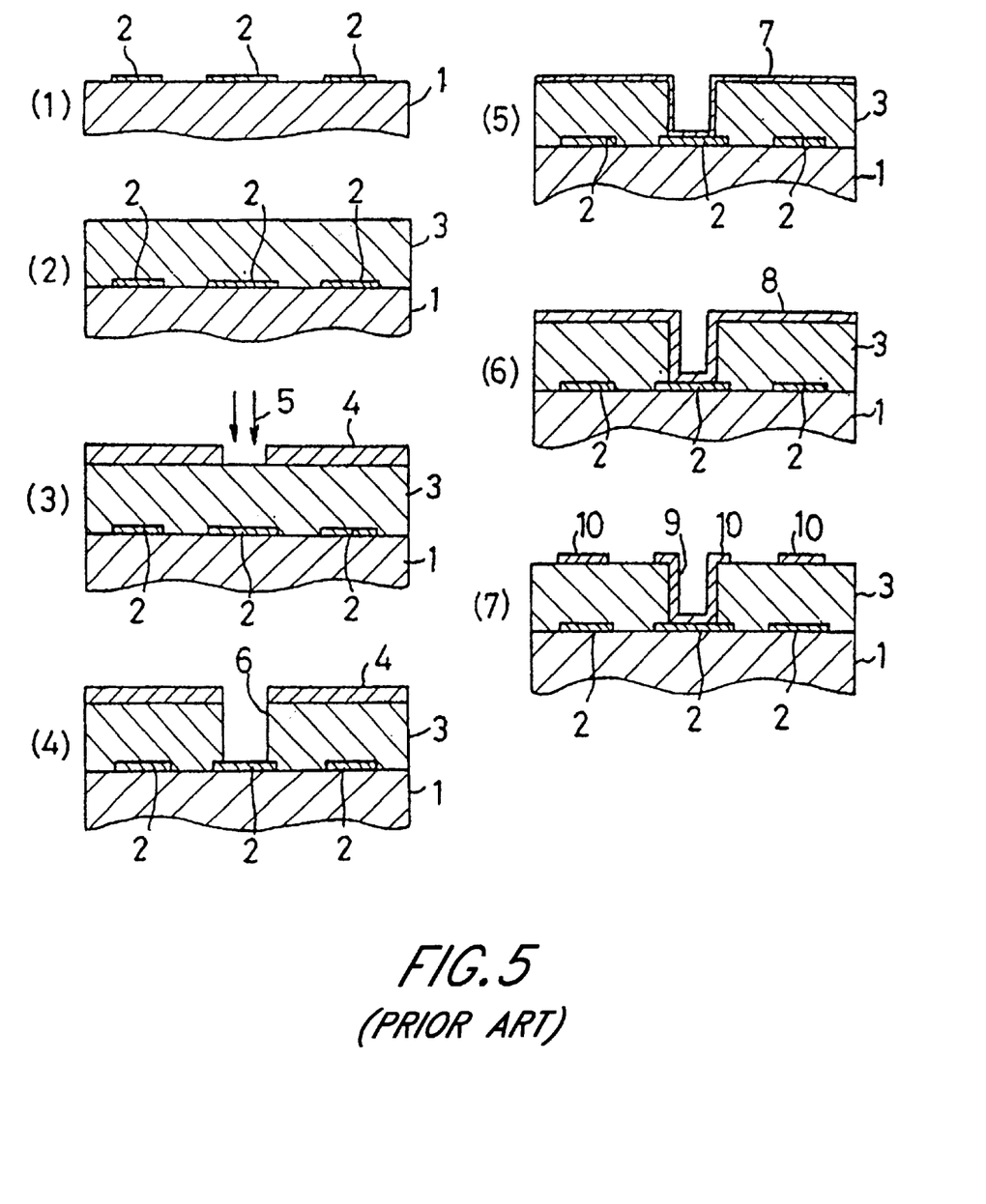
Figure 6:
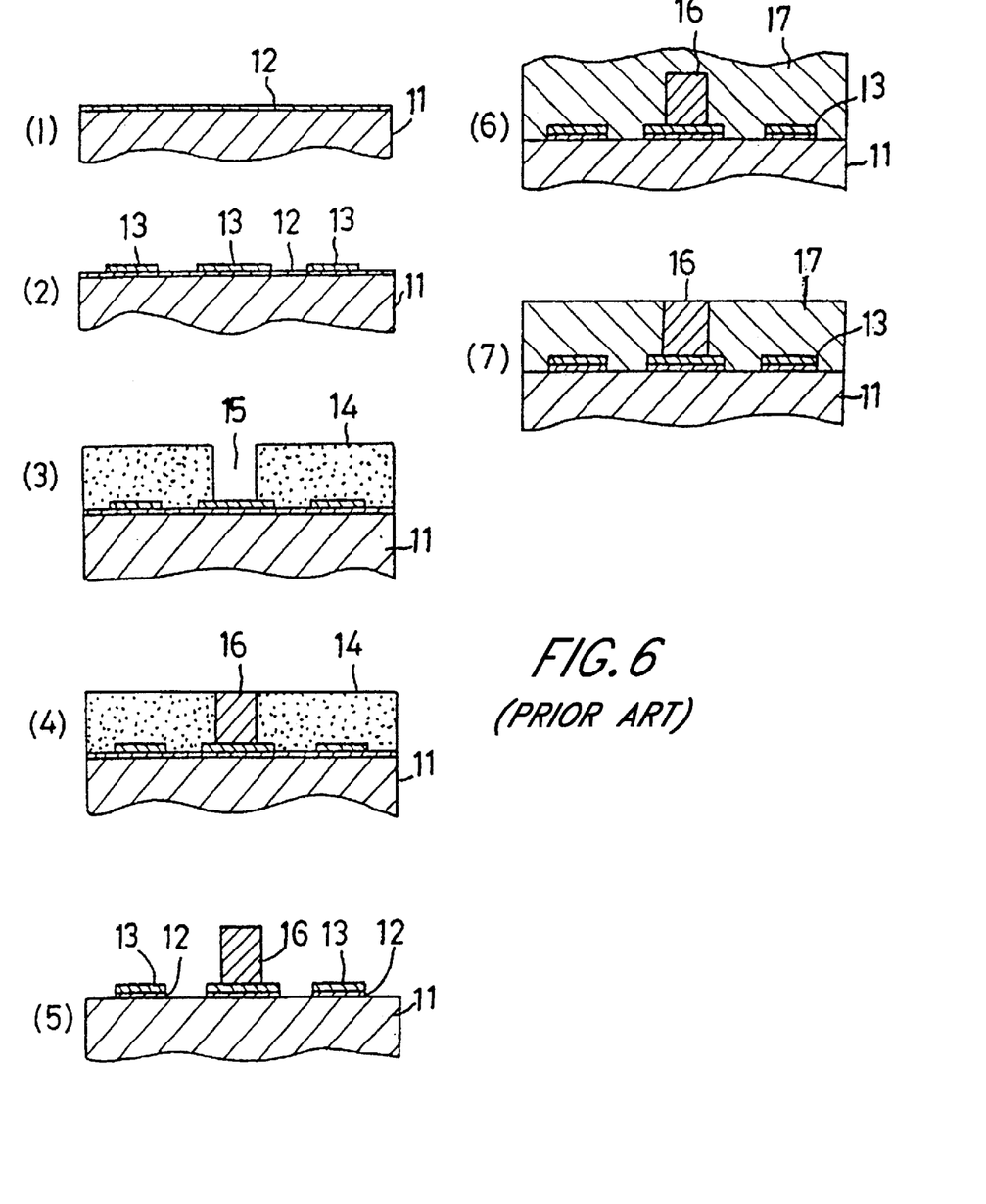

According to the above steps, a wiring layer is further formed on the top layer, so that a multilayer wiring board 30 shown in FIG. 4, for example, can be manufactured. The multilayer wiring board 30 is a six-layer board having a circuit configuration in that wiring layers 31 through 36 are laminated. Inside the board, inter-layer connecting structures 37, 38 and 39 corresponding to a via hole are formed by the column-like metallic body 24a. The inter-layer connecting structure 37 connects the first layer and the second layer in the case where the wiring layer is formed on both surfaces of the substrate. The inter-layer connecting structure 38 connects the second layer and the third layer. The inter-layer connecting structure 39 connects the first layer and the third layer. In the present invention, in the case where the first layer is connected with the third layer, the column-like metallic body 24a which connects the second layer and the third layer may be further formed above the column-like metallic body 24a which connects the first layer and the second layer.

Another Embodiment (1) The above embodiment explains the example that the column-like metallic body is formed on both the surface of the substrate, but the column-like metallic body may be formed only on one surface of the substrate, namely, the wiring layer may be laminated only on one surface. In this case, since the surface of the substrate where the wiring layer is not laminated can be supported firmly, the grinding and abrading step can be executed easily and securely. As a result, the reliability of the obtained multilayer wiring board is heightened.

(2) The above embodiment explains the example that the conductive layer is formed by plating, but conductive paste is applied along the pattern of the wiring layer and is cured, so that the conductive layer can be formed. In this case, the screen printing or the like can be used.

In addition, solder coating using solder or the like can be carried out. For example, in the case where tin-lead solder alloy is used, an alkaline etching solution is used as an etching solution for a plating layer (copper) so that the solder can show durability.

Further, the conductive layer can be formed according to sputtering by chromium or rhodium. In this case, the portion of the wiring layer other than the pattern is coated with a mask material, and only the portion of the wiring layer where the pattern is formed is coated with the conductive layer.

(3) The above embodiment explains the example that the mask layer is formed by printing, but the mask layer may be formed by using dry film resist. In this case, thermocompression boding, exposure and image development of the dry film resist are carried out. Moreover, in order to remove the mask layer (peeling), methylene chloride, sodium hydroxide or the like is used.

(4) The above embodiment explains the example that the insulating material is ground and abraded so that the insulating layer having the same thickness as the height of the column-like metallic body is formed. However, the resin as the insulating material is heated and pressurized so that the insulating layer having approximately the same thickness as the height of the column-like metallic body may be formed. In this case, the insulating resin which slightly remains on the column-like metallic body can be easily removed by a plasma process or the like, or it is abraded after heating so as to be flattened.

INDUSTRIAL APPLICABILITY

The present invention is useful particularly for a method of manufacturing a multilayer wiring board having a structure that a lower wiring layer is conductively connected with an upper wiring layer by a column-like metallic body. More specifically, at the step of forming the column-like metallic body, the column-like metallic body having uniform height can be formed for short time by a simple and low-priced method. Therefore, the present invention has high, industrial applicability.

What is claimed is:

1. A method of manufacturing a multilayer wiring board comprising steps of (i) forming a column-like metallic body on a patterned lower wiring layer, and (ii) forming an upper wiring layer whose part is conductively connected with said column-like metallic body, wherein step (i) comprises:

(a) coating said patterned lower wiring layer with a conductor showing durability during a subsequent step (d) of etching metal composing said column-like metallic body, thereby forming a conductive layer;

(b) forming a plating layer of the metal composing said column-like metallic body on a whole surface including said conducive layer;

(c) forming a mask layer on a surface portion of said plating layer where said column-like metallic body is formed; and (d) etching said plating layer.

2. The manufacturing method according to claim 1, wherein step (a) is conducted by electroless plating wherein metal composing the conductor deposits on said lower wiring layer while using metal composing said lower wiring layer as a catalyst so as to form said conductive layer.

3. The manufacturing method according to claim 2, wherein the metal composing said column-like metallic body is copper, and said conductive layer is made of nickel-gold alloy or tin-lead solder alloy.

4. The manufacturing method according to claim 1, wherein said mask layer is formed by a printing method.

5. A multilayer wiring board which is manufactured by the manufacturing method according to claim 1.

6. A method of manufacturing a multilayer wiring board comprising a lower wiring layer, an upper wiring layer, and a column-like metallic body connecting the lower wiring layer and the upper wiring layer, said method comprising:

(a) forming a lower wiring layer in a pattern on a substrate;

(b) coating the lower wiring layer with a conductive layer having durability against subsequent etching (e) for forming a column-like metallic body;

(c) forming a plating layer on top of the conductive layer and the substrate, said plating layer having a thickness corresponding to the distance between the lower wiring layer and an upper wiring layer;

(d) forming a mask layer on a surface of the plating layer where the column-like metallic body is subsequently formed;

(e) etching the plating layer to form the column-like metallic body;

(f) removing the mask; and (g) forming an upper wiring layer on top of the column-like metallic body, thereby connecting the lower wiring layer and the upper wiring layer.

7. The method according to claim 6, wherein steps (a) through (g) are repeated to form more than two wiring layers.

8. The method according to claim 6, wherein the conductive layer is formed by electroless plating wherein the lower wiring layer-composing metal is used as a catalyst.

9. The method according to claim 6, wherein the column-like metallic body is made of copper, the conductive layer is made of a nickel-sold alloy or tin-lead solder alloy.

10. The method according to claim 6, wherein the mask is formed by a printing method.

* * * * *